(12) United States Patent
Bae et al.

(10) Patent No.: US 8,975,001 B2
(45) Date of Patent: Mar. 10, 2015

(54) PHOTORESIST COMPOSITIONS AND METHODS OF FORMING PHOTOLITHOGRAPHIC PATTERNS

(75) Inventors: Young Cheol Bae, Weston, MA (US); Rosemary Bell, Wayland, MA (US); Thomas Cardolaccia, Needham, MA (US); Seung-Hyun Lee, Marlborough, MA (US); Yi Liu, Wayland, MA (US); Jong Keun Park, Hudson, MA (US)

(73) Assignee: Rohm and Haas Electronics Materials LLC, Marlborough, MA (US)

( * ) Notice: Subject to any disclaimer, the term of this patent is extended or adjusted under 35 U.S.C. 154(b) by 2 days.

(21) Appl. No.: 13/407,508

(22) Filed: Feb. 28, 2012

(65) Prior Publication Data

US 2012/0219901 A1 Aug. 30, 2012

Related U.S. Application Data

(60) Provisional application No. 61/447,686, filed on Feb. 28, 2011.

(51) Int. Cl.
*G03F 7/004* (2006.01)
*G03F 7/20* (2006.01)
*G03F 7/039* (2006.01)
*G03F 7/09* (2006.01)
*G03F 7/32* (2006.01)

(52) U.S. Cl.
CPC ............ *G03F 7/0397* (2013.01); *G03F 7/2041* (2013.01); *G03F 7/091* (2013.01); *G03F 7/325* (2013.01)
USPC ........................................ 430/270.1; 430/322

(58) Field of Classification Search
None
See application file for complete search history.

(56) References Cited

U.S. PATENT DOCUMENTS

| 5,326,840 | A | 7/1994 | Przybilla et al. | |
| 6,737,212 | B1 * | 5/2004 | Takahashi | 430/191 |
| 6,770,420 | B2 | 8/2004 | Dietliker et al. | |
| 6,790,579 | B1 | 9/2004 | Goodall et al. | |
| 2004/0197707 | A1 | 10/2004 | Yamanaka et al. | |
| 2008/0026331 | A1 * | 1/2008 | Hasegawa et al. | 430/327 |
| 2009/0042147 | A1 | 2/2009 | Tsubaki | |
| 2009/0155718 | A1 | 6/2009 | Chen et al. | |
| 2010/0015554 | A1 * | 1/2010 | Saegusa et al. | 430/286.1 |
| 2010/0028804 | A1 | 2/2010 | Iwato et al. | |
| 2010/0183980 | A1 * | 7/2010 | Yamaguchi | 430/281.1 |
| 2010/0233626 | A1 * | 9/2010 | Shimizu et al. | 430/285.1 |

(Continued)

FOREIGN PATENT DOCUMENTS

EP 0 064 222 A2 11/1982
JP 57173832 10/1982

(Continued)

OTHER PUBLICATIONS

Machine translation JP 2009-080842. Apr. 16, 2009.*

(Continued)

*Primary Examiner* — Anca Eoff
*Assistant Examiner* — Alyssa L Cepluch
(74) *Attorney, Agent, or Firm* — Jonathan D. Baskin

(57) ABSTRACT

Provided are photoresist compositions useful in forming photolithographic patterns. Also provided are substrates coated with the photoresist compositions and methods of forming photolithographic patterns. The compositions, methods and coated substrates find particular applicability in the manufacture of semiconductor devices.

19 Claims, 2 Drawing Sheets

(56) References Cited

U.S. PATENT DOCUMENTS

| | | | |
|---|---|---|---|
| 2010/0323305 A1* | 12/2010 | Tsubaki et al. | 430/325 |
| 2011/0159253 A1 | 6/2011 | Kang | |
| 2011/0294069 A1* | 12/2011 | Bae et al. | 430/283.1 |
| 2012/0064456 A1* | 3/2012 | Bae et al. | 430/270.1 |
| 2012/0171617 A1* | 7/2012 | Bae et al. | 430/285.1 |
| 2012/0288794 A1* | 11/2012 | Bae et al. | 430/270.1 |
| 2012/0308927 A1* | 12/2012 | Bae et al. | 430/270.1 |
| 2013/0011783 A1* | 1/2013 | Ober et al. | 430/270.1 |

FOREIGN PATENT DOCUMENTS

| | | |
|---|---|---|
| JP | 57173833 | 10/1982 |
| JP | 2000199953 A | 7/2000 |
| JP | 2008153373 A | 7/2008 |
| JP | 2008281975 A | 11/2008 |
| JP | 2009080482 A * | 4/2009 |
| WO | WO 2010/140709 A1 | 12/2010 |
| WO | WO 2010/147228 A1 | 12/2010 |

OTHER PUBLICATIONS

Musafumi Asano, "Sub-100nm Lithography with KrF Exposure Using Multiple Development Method", Jpn. J. Appl. Phys., 1999, pp. 6999-7003, vol. 38.

V. Truffert, et al, "Ultimate Contact Hole Resolution Using Immersion Lithography With Line/Space Imaging", Proc. of SPIE, Optical Microlithography XXII, 2009, pp. 72740N-1 thru 72740N-12, vol. 7274.

Shinji Tarutani, et al, "Development of materials and processes for negative tone development toward 32-nm node 193-nm immersion double-patterning process", Advanced in Resist Materials and Processing Technology Prof. of SPIE, 2009, pp. 72730C-1 thru 72730C-8, vol. 7273.

European Search Report of corresponding European Application No. 12 15 7113 Jun. 11, 2012.

* cited by examiner

PHOTORESIST COMPOSITIONS AND METHODS OF FORMING PHOTOLITHOGRAPHIC PATTERNS

FIELD

The invention relates generally to the manufacture of electronic devices. More specifically, this invention relates to photoresist compositions, coated substrates and to photolithographic methods which allow for the formation of fine patterns using a negative tone development process.

BACKGROUND

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Exposure to actinic radiation causes the acid generator to form an acid which, during post-exposure baking, causes cleavage of the acid-labile groups in the resin. This creates a difference in solubility characteristics between exposed and unexposed regions of the resist in an aqueous alkaline developer solution. Exposed regions of the resist are soluble in the aqueous alkaline developer and are removed from the substrate surface, whereas unexposed regions, which are insoluble in the developer, remain after development to form a positive image.

One approach to achieving nm-scale feature sizes in semiconductor devices is the use of short wavelengths of light, for example, 193 nm or less, during exposure of chemically amplified photoresists. To further improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium. When using water as the immersion fluid, the maximum numerical aperture can be increased, for example, from 1.2 to 1.35. With such an increase in numerical aperture, it is possible to achieve a 40 nm half-pitch resolution in a single exposure process, thus allowing for improved design shrink. This standard immersion lithography process, however, is generally not suitable for manufacture of devices requiring greater resolution, for example, for the 32 nm and 22 nm half-pitch nodes.

Considerable effort has been made to extend the practical resolution capabilities of positive tone development in immersion lithography from both a materials and processing standpoint. One such example involves negative tone development (NTD) of a traditionally positive-type chemically amplified photoresist. NTD allows for use of the superior imaging quality obtained with bright field masks for printing the critical dark field layers. NTD resists typically employ a resin having acid-labile (or acid-cleavable) groups and a photoacid generator. Exposure to actinic radiation causes the photoacid generator to form an acid which, during post-exposure baking, causes cleavage of the acid-labile groups giving rise to a polarity switch in the exposed regions. As a result, a difference in solubility characteristics is created between exposed and unexposed regions of the resist such that unexposed regions of the resist can be removed by particular developers, typically organic developers such as ketones, esters or ethers, leaving behind a pattern created by the insoluble exposed regions. Such a process is described, for example, in U.S. Pat. No. 6,790,579, to Goodall et al. That document discloses a photoresist composition comprising an acid-generating initiator and a polycyclic polymer containing recurring acid labile pendant groups along the polymer backbone. The exposed areas can be selectively removed with an alkaline developer or, alternatively, the unexposed regions can be selectively removed by treatment with a suitable nonpolar solvent for negative tone development.

Conventional 193 nm photoresist polymers typically include alkyl adamantyl methacrylate units in which the alkyl adamantly moieties function as acid labile leaving groups. Such leaving groups, however, exhibit very slow dissolution rates in NTD developers such as 2-heptanone and n-butyl acetate (NBA). Low dissolution rates have been found to result in poor pattern fidelity. Increasing the dissolution rate of such polymers in an NTD developer can be accomplished by use of relatively low molecular weight polymers. This is not a viable total solution as lower molecular weight polymers have been found to exhibit poor photospeed and CD uniformity.

There is a continuing need in the art for improved photoresist compositions and photolithographic methods for negative tone development which allow for the formation of fine patterns in electronic device fabrication and which avoid or conspicuously ameliorate one or more of the foregoing problems associated with the state of the art.

SUMMARY

In accordance with a first aspect of the invention, photoresist compositions are provided. The photoresist compositions comprise: a first polymer comprising units of the following general formulae (I), (II) and (III):

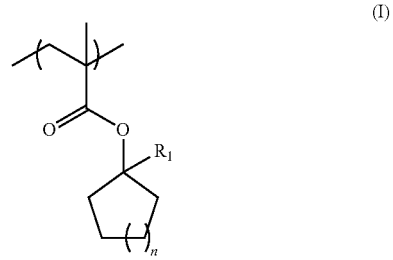

(I)

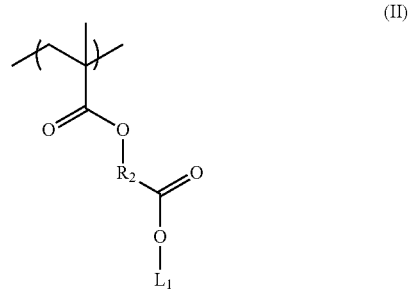

(II)

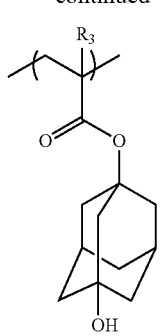

wherein: $R_1$ represents a $C_1$ to $C_3$ alkyl group; $R_2$ represents a $C_1$ to $C_3$ alkylene group; $R_3$ represents hydrogen or methyl; $L_1$ represents a lactone group; and n is 1 or 2; a second polymer which is a $C_3$ to $C_7$ alkyl (meth)acrylate homopolymer or copolymer; and a photoacid generator.

Also provided are coated substrates. The coated substrates comprise a substrate and a layer of a photoresist composition as described herein over a surface of the substrate.

Also provided are methods of forming photolithographic patterns. The methods comprise: (a) providing a substrate comprising one or more layer to be patterned over a surface of the substrate; (b) applying a layer of a photoresist composition as described herein over the one or more layer to be patterned; (c) patternwise exposing the photoresist composition layer to actinic radiation; (d) heating the exposed photoresist composition layer in a post-exposure bake process; and (e) applying a developer to the photoresist composition layer to remove a portion of the photoresist layer, thereby forming a photoresist pattern, wherein unexposed regions of the photoresist layer are removed by the developer to form the photoresist pattern.

Also provided are electronic devices formed by the methods described herein.

As used herein: "g" means grams; wt % means weight percent; "L" means liter; "mL" means milliliter; "nm" means nanometer; "mm" means millimeter; "min" means minute; "h" means hour; "Å" means Angstrom; "mol %" means mole percent; "Mw" means weight average molecular weight; and "Mn" means number average molecular weight; "PDI" means polydispersity index=Mw/Mn; "copolymer" is inclusive of polymers containing two or more different types of polymerized units; and the articles "a" and "an" are inclusive of one or more.

BRIEF DESCRIPTION OF THE DRAWINGS

The present invention will be described with reference to the following drawings, in which like reference numerals denote like features, and in which.

DETAILED DESCRIPTION

Photoresist Compositions

Figure 1A:
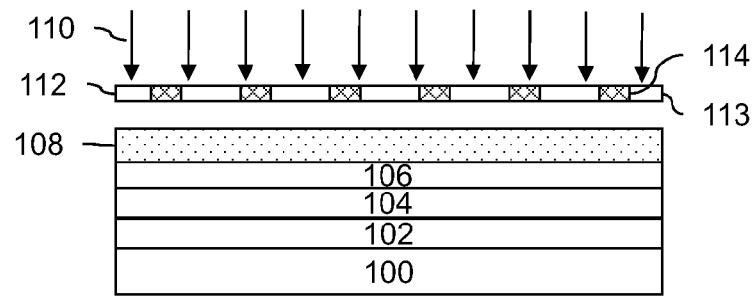
FIG. 1A-E illustrates a process flow for forming a photolithographic pattern in accordance with the invention.

The photoresist compositions of the invention include a first, matrix polymer, a second, additive polymer, a photoacid generator and can include various optional components. The photoresist compositions are chemically-amplified materials and are particularly suited for use in negative tone development processes.

Preferred photoresist compositions of the invention when used to form very fine patterns in a negative tone development process can provide improvements in one or more of resolution, top loss, focus latitude, exposure latitude and defectivity as compared with conventional positive-tone photolithographic techniques. Preferred photoresists can further provide geometrically uniform resist patterns for contact holes. These benefits can be achieved when using the compositions in dry lithography or immersion lithography processes. When used in immersion lithography, preferred photoresist compositions can further exhibit reduced migration (leaching) of photoresist materials into an immersion fluid allowing for a topcoat-free process.

A. Matrix Polymer

The photoresist compositions include a matrix polymer which is acid-sensitive. This means that the matrix polymer as part of a layer of the photoresist composition undergoes a change in solubility in an organic developer as a result of reaction with acid generated from the photoacid generator following softbake, exposure to activating radiation and post exposure bake.

The matrix polymer comprises units of the following general formulae (I), (II) and (III):

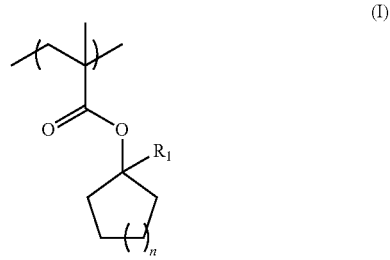

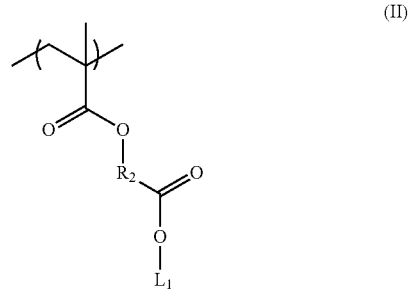

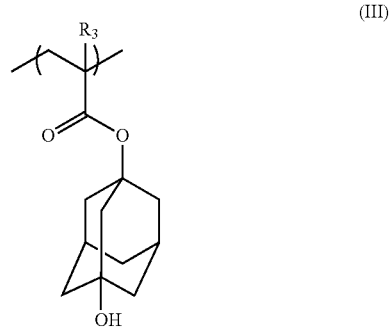

wherein: $R_1$ represents a $C_1$ to $C_3$ alkyl group; $R_2$ represents a $C_1$ to $C_3$ alkylene group; $R_3$ represents hydrogen or methyl; $L_1$ represents a lactone group; and n is 1 or 2.

The unit of general formula (I) includes an acid labile group that undergoes a photoacid-promoted deprotection reaction on exposure to activating radiation and heat treatment. This allows for a switch in polarity of the matrix polymer, leading to a change in solubility of the polymer and photoresist composition in an organic developer. Suitable monomers for forming units of formula (I) include, for example, the following:

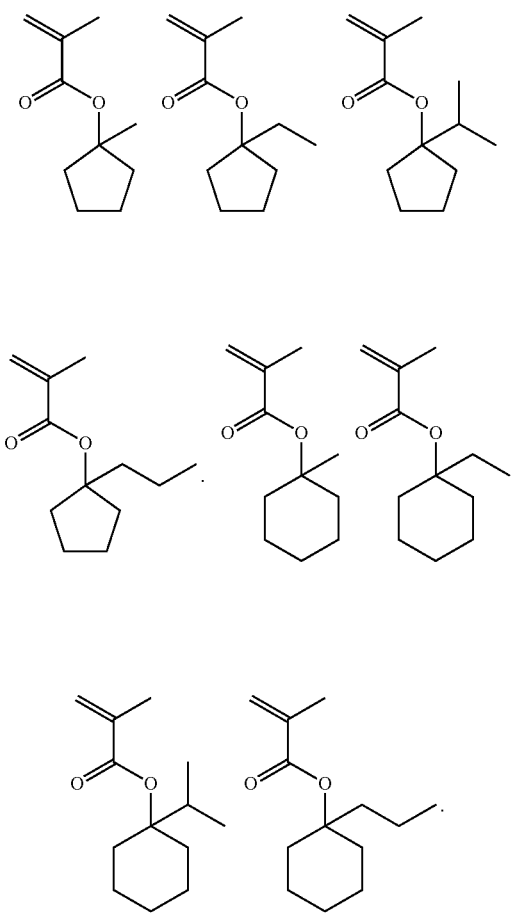

The unit of general formula (II) includes an extended lactone moiety effective to control the dissolution rate of the matrix polymer and photoresist composition. Suitable monomers for forming units of general formula (II) include, for example, the following:

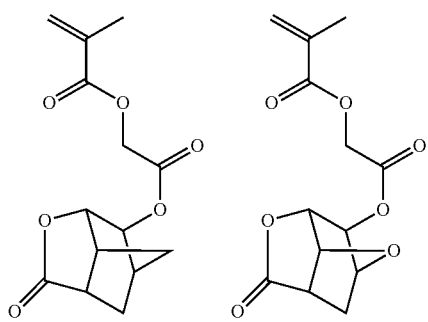

The unit of formula (III) provides a polar group, which enhances etch resistance of the matrix polymer and photoresist composition and provides additional means to control the dissolution rate of the matrix polymer and photoresist composition. Monomers for forming the unit of formula (III) include 3-hydroxy-1-adamantyl methacrylate (HAMA) and preferably 3-hydroxy-1-adamantyl acrylate (HADA).

The matrix polymer can include one or more additional units of general formulae (I), (II) and/or (III) different from the first units. Where additional such units are present in the matrix polymer, they will preferably include an additional leaving group-containing unit of formula (I) and/or a lactone-containing unit of formula (II). In addition to the polymerized units described above, the matrix polymer can include one or more additional units which are not of general formula (I), (II) or (III). For example, a particularly suitable lactone group-containing unit is of the following general formula (IV):

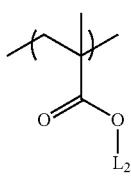

(IV)

wherein: $L_2$ represents a lactone group; and the unit of general formula (IV) is different from the unit of general formula (II). The following exemplary monomers are suitable for use in forming the additional lactone unit of general formula (IV):

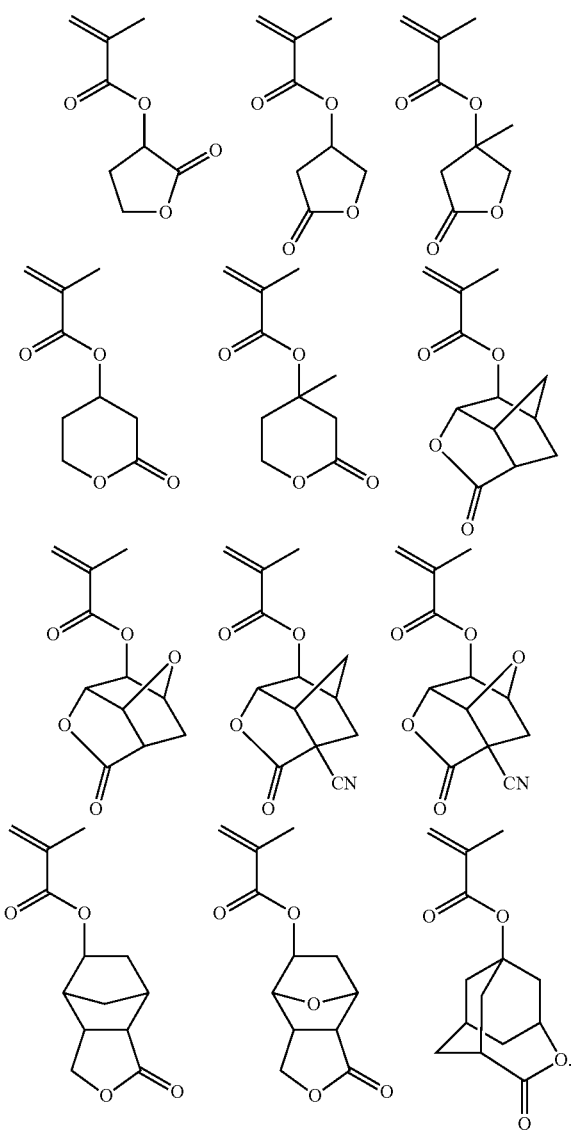

Preferably, $L_1$ in the unit of general formula (II) and $L_2$ in the unit of general formula (IV) are independently chosen from the following lactone groups:

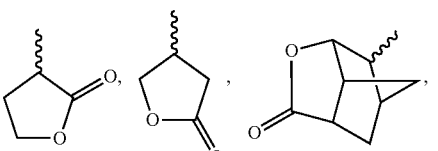

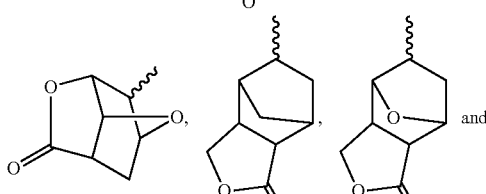

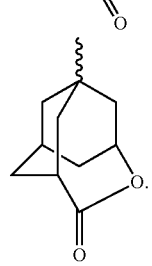

Typically, the additional units for the matrix polymer will include the same or similar polymerizable group as those used for the monomers used to form the units of general formula (I), (II) or (III), but may include other, different polymerizable groups in the same polymer backbone, such as those which contain polymerized units of vinyl or a non-aromatic cyclic olefin (endocyclic double bond) such as an optionally substituted norbornene. For imaging at sub-200 nm wavelengths such as 193 nm, the matrix polymer is typically substantially free (e.g., less than 15 mole %) of phenyl, benzyl or other aromatic groups where such groups are highly absorbing of the radiation. Suitable additional monomeric units for the polymer include, for example, one or more of the following: monomeric units containing ethers, lactones or esters, such as 2-methyl-acrylic acid tetrahydro-furan-3-yl ester, 2-methyl-acrylic acid 2-oxo-tetrahydro-furan-3-yl ester, 2-methyl-acrylic acid 5-oxo-tetrahydro-furan-3-yl ester, 2-methyl-acrylic acid 3-oxo-4,10-dioxa-tricyclo [5.2.1.02,6]dec-8-yl ester, 2-methyl-acrylic acid 3-oxo-4-oxa-tricyclo[5.2.1.02,6]dec-8-yl ester, 2-methyl-acrylic acid 5-oxo-4-oxa-tricyclo[4.2.1.03,7]non-2-yloxycarbonylmethyl ester, acrylic acid 3-oxo-4-oxa-tricyclo[5.2.1.02,6]dec-8-yl ester, 2-methyl-acrylic acid 5-oxo-4-oxa-tricyclo [4.2.1.03,7]non-2-yl ester, and 2-methyl-acrylic acid tetrahydro-furan-3-yl ester; monomeric units having polar groups such as alcohols and fluorinated alcohols, such as 2-methyl-acrylic acid 3-hydroxy-adamantan-1-yl ester, 2-methyl-acrylic acid 2-hydroxy-ethyl ester, 6-vinyl-naphthalen-2-ol, 2-methyl-acrylic acid 3,5-dihydroxy-adamantan-1-yl ester, 2-methyl-acrylic acid 6-(3,3,3-trifluoro-2-hydroxy-2-trifluoromethyl-propyl)-bicyclo[2.2.1]hept-2-yl, and 2-bicyclo[2.2.1]hept-5-en-2-ylmethyl-1,1,1,3,3,3-hexafluoro-propan-2-ol; monomeric units having acid labile moieties, for example, ester groups that contain a tertiary non-cyclic alkyl carbon such as t-butyl, or a tertiary alicyclic carbon such as methyladamantyl or ethylfenchyl covalently linked to a carboxyl oxygen of an ester of the polymer, 2-methyl-acrylic acid 2-(1-ethoxy-ethoxy)-ethyl ester, 2-methyl-acrylic acid 2-ethoxymethoxy-ethyl ester, 2-methyl-acrylic acid 2-methoxymethoxy-ethyl ester, 2-(1-ethoxy-ethoxy)-6-vinyl-naphthalene, 2-ethoxymethoxy-6-vinyl-naphthalene, and 2-methoxymethoxy-6-vinyl-naphthalene. The additional units if used are typically present in the polymer in an amount of from 10 to 30 mol %.

Exemplary preferred matrix polymers include, for example, the following:

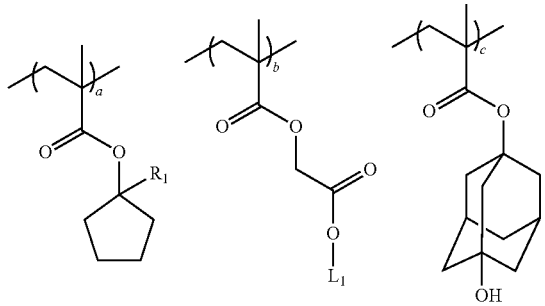

wherein: $0.3<a<0.7$; $0.3<b<0.6$; and $0.1<c<0.3$; $R_1$ represents a $C_1$ to $C_3$ alkyl group; and $L_1$ represents a lactone group;

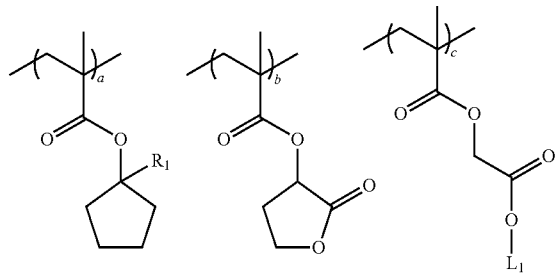

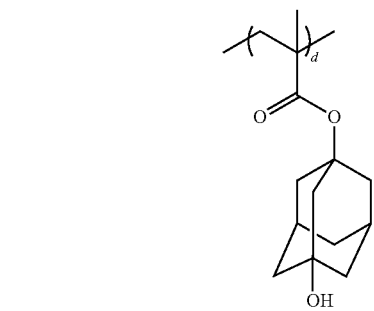

wherein: $0.3<a<0.7$; $0.1<b<0.4$; $0.1<c<0.4$, and $0.1<d<0.3$; $R_1$ represents a $C_1$ to $C_3$ alkyl group; and $L_1$ represents a lactone group;

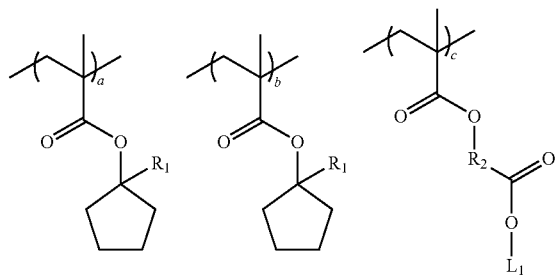

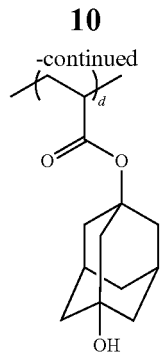

wherein: $0.1<a<0.5$; $0.1<b<0.5$; $0.2<c<0.6$; and $0.1<d<0.3$; $R_1$ independently represents a $C_1$ to $C_3$ alkyl group; $R_2$ represents a $C_1$ to $C_3$ alkylene group; and $L_1$ represents a lactone group; and

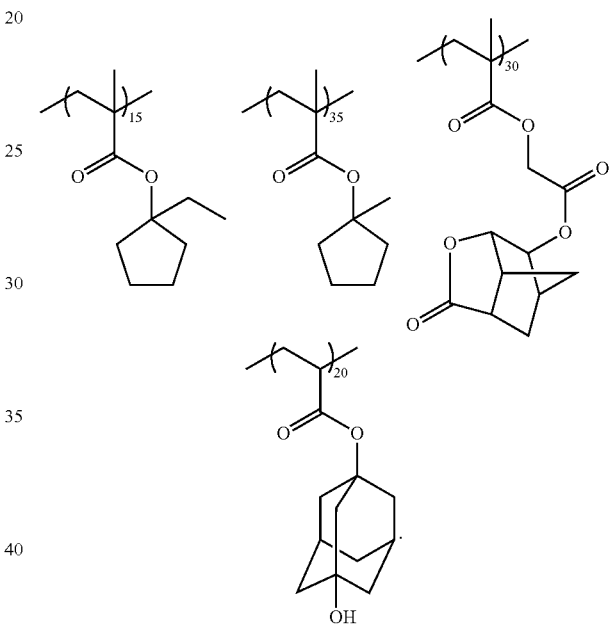

Blends of two or more matrix polymer can be used in the compositions of the invention. The matrix polymer is present in the resist composition in an amount sufficient to obtain a uniform coating of desired thickness. Typically, the matrix polymer is present in the composition in an amount of from 70 to 95 wt % based on total solids of the resist composition. Because of improved dissolution properties of the matrix polymer in organic developers, useful molecular weights for the matrix polymer are not limited to lower values, but cover a very broad range. For example, the weight average molecular weight $M_w$ of the polymers is typically less than 100,000, for example, from 5000 to 50,000, more typically from 6000 to 30,000 or from 7,000 to 25,000.

Suitable monomers used in forming the matrix polymers are commercially available and/or can be synthesized using known methods. The matrix polymers can readily be synthesized by persons skilled in the art using the monomers with known methods and other commercially available starting materials.

B. Additive Polymer

The second, additive polymer is a $C_3$ to $C_7$ alkyl (meth) acrylate, preferably methacrylate, homopolymer or copolymer. The additive polymer can be linear, branched or cyclic.

The second polymer has a lower surface energy than that of the matrix polymer and should be substantially non-miscible with the matrix polymer. A typical surface free energy of the additive polymer is from 10 to 40 mJ/m². In this way, segregation or migration of the first additive to the top or upper portions of an applied photoresist layer during the coating process to form a surface layer substantially made up of the additive polymer can be facilitated. Following exposure and post exposure bake (PEB), the resist coating layer is developed in a developer, typically an organic solvent. The developer removes unexposed regions of the photoresist layer and the surface layer of the exposed regions. It is believed that removal of the surface layer of the exposed resist portions provides improved resist profiles as a result of the reduction in surface inhibition. Also a result of the additive polymer's surface migration, the photoresist composition layer can, in the case of an immersion lithography process, effectively inhibit migration of photoresist materials out of the resist layer into the immersion fluid.

The additive polymer is preferably acid-insensitive. This means that the additive polymer as part of a layer of the photoresist composition does not react with acid generated from the photoacid generator following softbake, exposure to activating radiation and post exposure bake. The additive polymer should therefore be free of photoacid-labile groups, such as photoacid-labile ester or acetal groups, which groups are typically included in matrix polymers. As a result of the additive polymer's migration to the resist surface during coating and its acid-inactivity, micro-bridge defects in trench formation and missing contact hole defects caused by the presence of stray light in regions of the resist blocked by a photomask can be minimized or avoided.

The additive polymer is preferably free of silicon and fluorine. Silicon-containing polymers exhibit a significantly lower etch rate than organic photoresist polymers in certain etchants. As a result, aggregation of a silicon-containing additive polymer at the surface of an organic matrix polymer-based resist layer can cause cone defects during the etching process. It is therefore desired that the additive polymer not contain silicon. Avoidance of fluorine-containing additive polymers is similarly desired. In this regard, the hydrophobic nature of certain fluorine-based polymers can be problematic as a result of their limited solubility in organic solvents useful in negative tone development. As well, it is desired to reduce the use of fluorinated materials for environmental purposes.

Preferred additive polymers are soluble in the same organic solvent(s) used to formulate the photoresist composition. Preferred additive polymers also will be soluble or become soluble upon post exposure bake (e.g., 120° C. for 60 seconds) in organic developers used in negative tone development processes.

Suitable additive polymers and monomers for making the additive polymers for use in the photoresist compositions of the invention are commercially available and/or can be made by persons skilled in the art. Exemplary suitable monomers useful in making the additive polymer are described below, but are not limited to these structures.

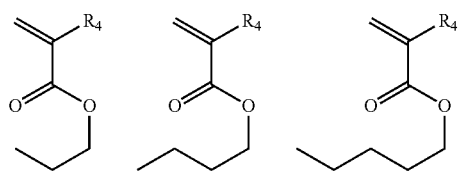

-continued

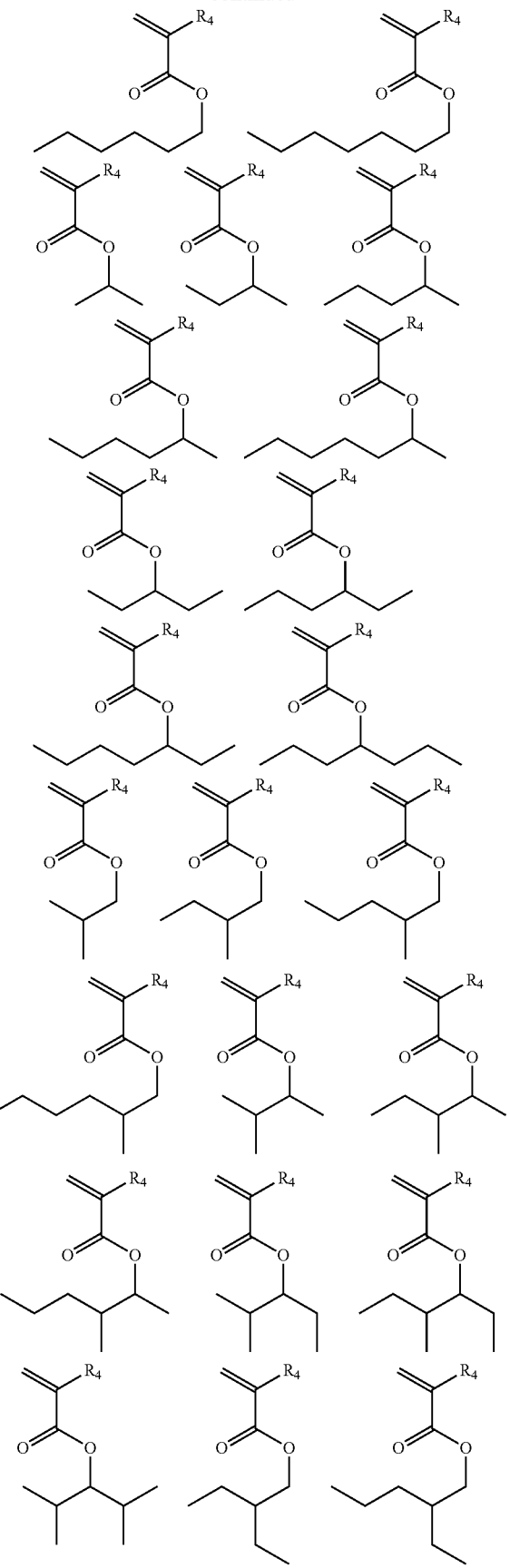

-continued

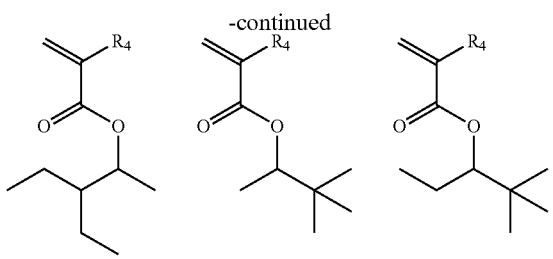

In the above formulas, $R_4$ is hydrogen or methyl. Preferred polymer additives include, for example, poly(n-butyl acrylate), poly(n-butyl methacrylate), poly(i-butyl acrylate), poly (i-butyl methacrylate), poly(t-butyl acrylate) and poly(t-butyl methacrylate). The additive polymer can be formed by two or more different types of polymerized units of the monomers to provide a copolymer. Preferred copolymers comprise units of n-butyl methacrylate and a second $C_3$ to $C_7$ alkyl (meth) acrylate different from the n-butyl methacrylate.

The one or more additive polymer typically may be present in the photoresist composition in relatively small amounts and still provide effective results. The content of the additive polymer may depend, for example, on whether the lithography is a dry or immersion-type process. For example, the additive polymer lower limit for immersion lithography is generally dictated by the need to prevent leaching of the resist components. A higher additive polymer content will typically result in pattern degradation. The one or more polymer additive is typically present in the compositions of the invention in an amount of from 0.1 to 10 wt %, more typically from 1 to 5 wt %, based on total solids of the photoresist composition. The weight average molecular weight of the additive polymer is typically less than 400,000, for example from 5000 to 50,000.

C. Photoacid Generator

The photosensitive composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris (trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

D. Solvent

Suitable solvents for the photoresist compositions of the invention include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

E. Other Components

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of resist compositions of the invention is an added base, for example, a caprolactam, which can enhance resolution of a developed resist relief image. Other suitable basic additives include: alkyl amines such as tripropylamine and dodecylamine, aryl amines such as diphenylamine, triphenylamine, aminophenol, 2-(4-aminophenyl)-2-(4-hydroxyphenyl)propane, and the like. The added base is suitably used in relatively small amounts, for example, from 0.01 to 5 wt %, preferably from 0.1 to 2 wt %, based on total solids of the photoresist composition.

Preparation of Photoresist Compositions

The photoresists used in accordance with the invention are generally prepared following known procedures. For example, a photoresist composition of the invention can be prepared by dissolving the components of the photoresist in the solvent component. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Photoresist compositions of the invention find particular applicability in negative-tone development processes such as described below.

Negative Tone Development Methods

The invention further provides methods for forming a photoresist relief image and producing an electronic device using photoresists of the invention. The invention also provides novel articles of manufacture comprising substrates coated with a photoresist composition of the invention. Processes in accordance with the invention will now be described with reference to FIG. 1A-E, which illustrates an exemplary process flow for forming a photolithographic pattern by negative tone development.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be patterned can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be patterned 102 will vary depending on the materials and particular devices being formed.

Depending on the particular layers to be patterned, film thicknesses and photolithographic materials and process to be used, it may be desired to dispose over the layers 102 a hard mask layer 104 and/or a bottom antireflective coating (BARC) 106 over which a photoresist layer 108 is to be coated. Use of a hard mask layer 104 may be desired, for example, with very thin resist layers, where the layers to be patterned require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 104 can include a single layer or a plurality of layers of different materials. The hard mask layer can be formed, for example, by chemical or physical vapor deposition techniques.

A bottom antireflective coating 106 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating 106 can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A photoresist composition as described herein is applied on the substrate over the antireflective layer 106 (if present) to form a photoresist layer 108. The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 108 is from about 500 to 3000 Å.

The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 108 is next exposed to activating radiation 110 through a first photomask 112 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions 113, 114 corresponding to regions of the resist layer to remain and be removed, respectively, in a subsequent development step for a positive-acting material in an NTD process as illustrated. The exposure wavelength is typically sub-400 nm, sub-300 nm or sub-200 nm, for example, 248 nm, 193 nm or EUV wavelengths (e.g., 13.5 nm). The methods find use in immersion or dry (non-immersion) lithography techniques. The exposure energy is typically from about 10 to 80 mJ/cm$^2$, dependent upon the exposure tool and the components of the photosensitive composition.

Figure 1B:
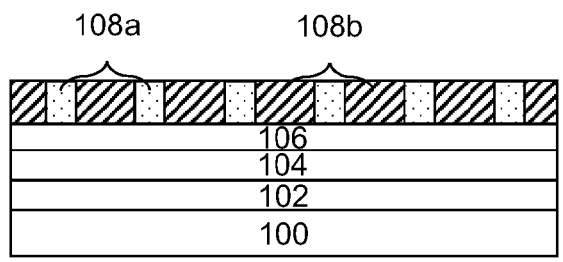

As shown in FIG. 1B, the exposed resist layer is made up of unexposed and exposed regions 108a, 108b. Following exposure of the photoresist layer 108, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

Figure 1C:
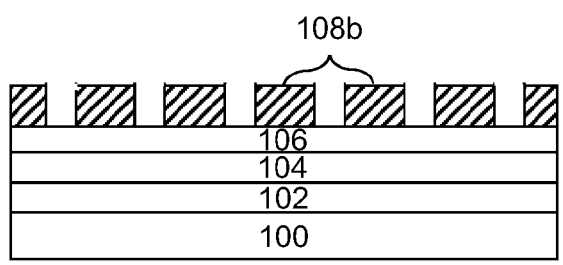

The exposed photoresist layer is next developed to remove unexposed regions 108a, leaving exposed regions 108b forming a resist pattern as shown in FIG. 1C. The developer is typically an organic developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate.

Mixtures of organic solvents can preferably be employed as a developer, for example, a mixture of a first and second organic solvent. The first organic solvent can be chosen from hydroxy alkyl esters such as methyl-2-hydroxyisobutyrate and ethyl lactate; and linear or branched $C_5$ to $C_6$ alkoxy alkyl acetates such as propylene glycol monomethyl ether acetate (PGMEA). Of the first organic solvents, 2-heptanone and 5-methyl-2-hexanone are preferred. The second organic solvent can be chosen from linear or branched unsubstituted $C_6$ to $C_8$ alkyl esters such as n-butyl acetate, n-pentyl acetate, n-butyl propionate, n-hexyl acetate, n-butyl butyrate and isobutyl butyrate; and linear or branched $C_8$ to $C_9$ ketones such as 4-octanone, 2,5-dimethyl-4-hexanone and 2,6-dimethyl-4-heptanone. Of the second organic solvents, n-butyl acetate, n-butyl propionate and 2,6-dimethyl-4-heptanone are preferred. Preferred combinations of the first and second organic solvent include 2-heptanone/n-butyl propionate, cyclohexanone/n-butyl propionate, PGMEA/n-butyl propionate, 5-methyl-2-hexanone/n-butyl propionate, 2-heptanone/2,6-dimethyl-4-heptanone and 2-heptanone/n-butyl acetate. Of these, 2-heptanone/n-butyl acetate and 2-heptanone/n-butyl propionate are particularly preferred.

The organic solvents are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 30 seconds being typical. Development is typically conducted at room temperature. The development process can be conducted without use of a cleaning rinse following development. In this regard, it has been found that the development process can result in a residue-free wafer surface rendering such extra rinse step unnecessary.

Figure 1D:
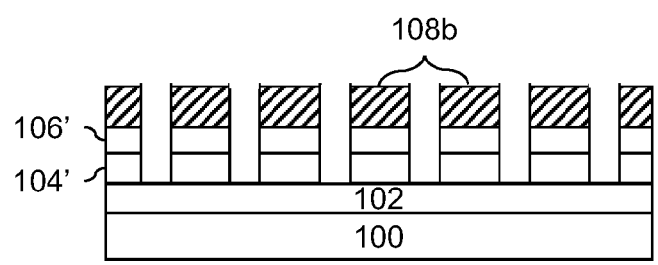

The BARC layer 106, if present, is selectively etched using resist pattern 108b as an etch mask, exposing the underlying hardmask layer 104. The hardmask layer is next selectively etched, again using the resist pattern 108b as an etch mask, resulting in patterned BARC and hardmask layers 106', 104', as shown in FIG. 1D. Suitable etching techniques and chemistries for etching the BARC layer and hardmask layer are known in the art and will depend, for example, on the particular materials of these layers. Dry-etching processes such as reactive ion etching are typical. The resist pattern 108b and patterned BARC layer 106' are next removed from the substrate using known techniques, for example, oxygen plasma ashing.

Figure 1E:
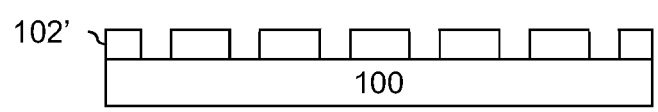

Using the hardmask pattern 104' as an etch mask, the one or more layers 102 are selectively etched. Suitable etching techniques and chemistries for etching the underlying layers 102 are known in the art, with dry-etching processes such as reactive ion etching being typical. The patterned hardmask layer 104' can next be removed from the substrate surface using known techniques, for example, a dry-etching process such as reactive ion etching. The resulting structure is a pattern of etched features 102' as illustrated in FIG. 1E. In an alternative exemplary method, it may be desirable to pattern the layer 102 directly using the resist pattern 108b without the use of a hardmask layer 104. Whether direct patterning is employed will depend on factors such as the materials involved, resist selectivity, resist pattern thickness and pattern dimensions.

The negative tone development methods of the invention are not limited to the exemplary methods described above. For example, the photoresist compositions of the invention can be used in a negative tone development double exposure method for making contact holes. An exemplary such process is a variation of the technique described with reference to FIG. 1, but using an additional exposure of the photoresist layer in a different pattern than the first exposure. In this process, the photoresist layer is exposed to actinic radiation through a photomask in a first exposure step. The photomask includes a series of parallel lines forming the opaque regions of the mask. Following the first exposure, a second exposure of the photoresist layer is conducted through a second photomask that includes a series of lines in a direction perpendicular to those of the first photomask. The resulting photoresist layer includes unexposed regions, once-exposed regions and twice-exposed regions. Following the second exposure, the photoresist layer is post-exposure baked and developed using a developer as described above. Unexposed regions corresponding to points of intersection of the lines of the two masks are removed, leaving behind the once- and twice-exposed regions of the resist. The resulting structure can next be patterned as described above with reference to FIG. 1. This method is particularly suited to formation of contact holes in the manufacture of electronic devices.

EXAMPLES

Matrix Polymer Synthesis

The following monomers were employed in the syntheses of copolymers used in the examples:

A. Leaving Group Monomers

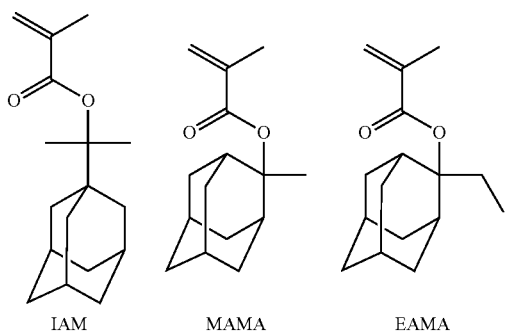

IAM          MAMA          EAMA

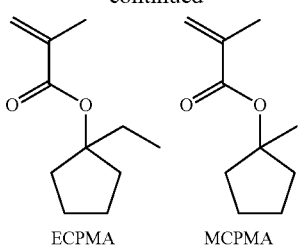

ECPMA     MCPMA

B. Lactone Group Monomers

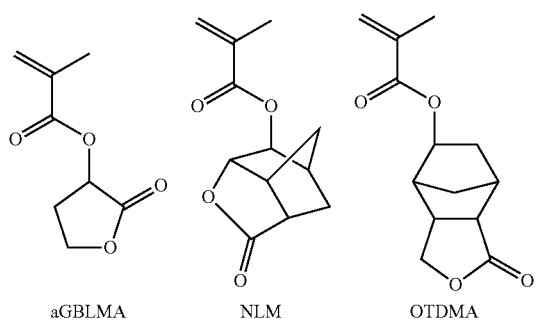

aGBLMA     NLM     OTDMA

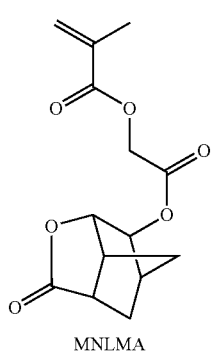

MNLMA

C. Polar Group Monomers

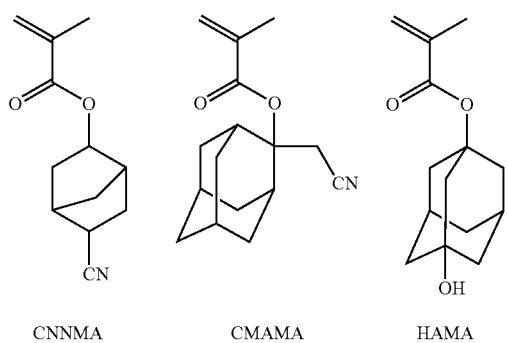

CNNMA     CMAMA     HAMA

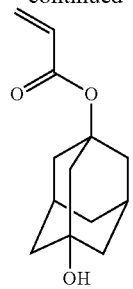

HADA

Representative examples for the polymerization process are given below and all the other copolymers were prepared using a similar process with different initiator loadings to control molecular weights.

Synthesis of poly(MCPMA/NLM) (P-17)

Monomers of MCPMA (17.234 g) and NLM (22.766 g) were dissolved in 60 g of propylene glycol methyl ether acetate (PGMEA). The monomer solution was degassed by bubbling with nitrogen for 20 min. PGMEA (31.938 g) was charged into a 500 mL three-neck flask equipped with a condenser and a mechanical stirrer and was degassed by bubbling with nitrogen for 20 min Subsequently the solvent in the reaction flask was brought to a temperature of 80° C. V601 (dimethyl-2,2-azodiisobutyrate) (2.831 g) was dissolved in 8 g of PGMEA and the initiator solution was degassed by bubbling with nitrogen for 20 min. The initiator solution was added into the reaction flask and then monomer solution was fed into the reactor dropwise over a 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methyl tert-butyl ether (MTBE) (1713 g). The powder precipitated was collected by filtration, air-dried overnight, re-dissolved in 120 g of THF, and re-precipitated into MTBE (1713 g). The final polymer was filtered, air-dried overnight and further dried under vacuum at 60° C. for 48 hours to give the following Polymer P-17 ($M_w$=8,060 and $M_w/M_n$=1.46):

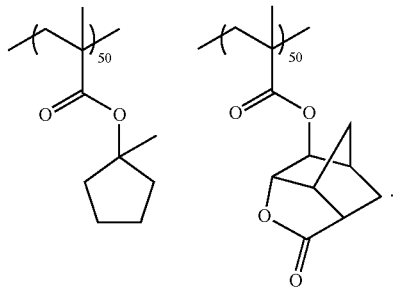

(P-17)

Synthesis of poly(MCPMA/OTDMA) P-18)

Monomers of MCPMA (16.636 g) and OTDMA (23.364 g) were dissolved in 60 g of PGMEA. The monomer solution was degassed by bubbling with nitrogen for 20 min. PGMEA (30.647 g) was charged into a 500 mL three-neck flask equipped with a condenser and a mechanical stirrer and was degassed by bubbling with nitrogen for 20 min. Subsequently, the solvent in the reaction flask was brought to a temperature of 80° C. V601 (2.277 g) was dissolved in 8 g of PGMEA and the initiator solution was degassed by bubbling with nitrogen for 20 min. The initiator solution was added into the reaction flask and then monomer solution was fed into the reactor dropwise over the 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in MTBE (1691 g). The powder precipitated was collected by filtration, air-dried overnight, re-dissolved in 120 g of THF, and re-precipitated into MTBE (1691 g). The final polymer was filtered, air-dried overnight and further dried under vacuum at 60° C. for 48 hours to give the following Polymer P-18 ($M_w$=8,814 and $M_w/M_n$=1.51):

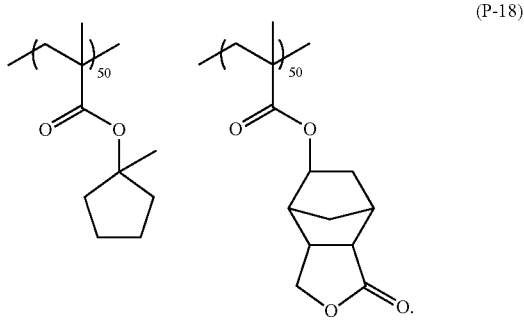

(P-18)

Synthesis of poly(MCPMA/MNLMA) (P-19)

Monomers of MCPMA (15.004 g) and MNLMA (24.996 g) were dissolved in 60 g of PGMEA. The monomer solution was degassed by bubbling with nitrogen for 20 min. PGMEA (31.084 g) was charged into a 500 mL three-neck flask equipped with a condenser and a mechanical stirrer and was degassed by bubbling with nitrogen for 20 min. Subsequently, the solvent in the reaction flask was brought to a temperature of 80° C. V601 (2.464 g) was dissolved in 8 g of PGMEA and the initiator solution was degassed by bubbling with nitrogen for 20 min. The initiator solution was added into the reaction flask and then monomer solution was fed into the reactor dropwise over the 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in MTBE (1699 g). The powder precipitated was collected by filtration, air-dried overnight, re-dissolved in 120 g of THF, and re-precipitated into MTBE (1699 g). The final polymer was filtered, air-dried overnight and further dried under vacuum at 60° C. for 48 hours to yield the following Polymer P-19 ($M_w$=8,653 and $M_w/M_n$=1.46).

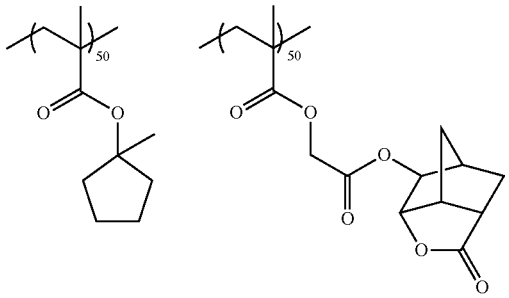

(P-19)

Synthesis of poly(ECPMA/MCPMA/MNLMA/HADA) (P-29)

Monomers of ECPMA (5.092 g), MCPMA (10.967 g), MNLMA (15.661 g), and HADA (8.280 g) were dissolved in 60 g of propylene glycol monomethyl ether acetate (PGMEA). The monomer solution was degassed by bubbling with nitrogen for 20 min. PGMEA (27.335 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (0.858 g) was dissolved in 8 g of PGMEA and the initiator solution was degassed by bubbling with nitrogen for 20 min. The initiator solution was added into the reaction flask and then monomer solution was fed into the reactor dropwise over a 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in MTBE (1634 g). The power precipitated was collected by filtration, air-dried overnight, re-dissolved in 120 g of THF, and re-precipitated into MTBE (1634 g). The final polymer was filtered, air-dried overnight and further dried under vacuum at 60° C. for 48 hours to give the following Polymer P-29 (Mw=20.120 and Mw/Mn=1.59).

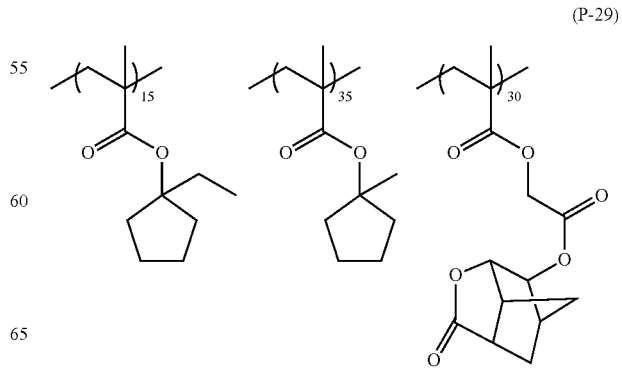

(P-29)

Additive Polymer Synthesis: Poly(n-butyl methacrylate) (PnBMA)

40 g of n-butyl methacrylate was dissolved in 60 g of PGMEA. The monomer solution was degassed by bubbling with nitrogen for 20 min. PGMEA (35.913 g) was charged into a 500 mL three-neck flask equipped with a condenser and a mechanical stirrer and was degassed by bubbling with nitrogen for 20 min. Subsequently, the solvent in the reaction flask was brought to a temperature of 80° C. V601 (1.295 g) was dissolved in 8 g of PGMEA and the initiator solution was degassed by bubbling with nitrogen for 20 min. The initiator solution was added into the reaction flask and then monomer solution was fed into the reactor dropwise over a 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (8/2) mixture (1781 g). The polymer precipitated was collected by filtration, re-dissolved in 120 g of THF, and re-precipitated into methanol/water (8/2) mixture (1781 g). The final polymer was filtered and dried under vacuum at 60° C. for 48 hours to give 31.5 g of PnBMA (Mw=17,600 and Mw/Mn=1.80).

Dissolution Rate Measurement of Polymers in Negative Tone Developer 200 mm silicon wafers were primed with hexamethyldisilazane (HMDS) for 30 seconds at 120° C. on a TEL CleanTrack. Polymer solutions, prepared at 10 wt % in PGMEA, were coated at 1100 rpm on the primed wafers and soft-baked at 120° C. for 60 seconds on a TEL CleanTrack ACT 8 coater/developer to provide a film thickness of 4000 Å. The polymer-coated wafers were measured on a ThermaWave Optiprobe (KLA-Tencor) to determine initial film thickness, then developed using 2-heptanone on a Tractrix developer (Site Services, Inc). Development of polymer films was carried out by dynamic dispense for 5 seconds while the wafer was spinning. The remaining film thickness after 5 second develop time was measured on a ThermaWave Optiprobe and dissolution rate of the polymer was calculated in Å/sec.

Table 1 shows dissolution rates with poly(IAM/aGBLMA/HAMA) copolymers with different molecular weights. Considering that 193 nm photoresists typically give dissolution rates higher than ~1000 Å/sec in an alkaline developer (2.38 wt % aqueous tetramethylammonium hydroxide solution), dissolution rates obtained from Examples 1-9 in the negative tone developer (2-heptanone) are very low. In order to achieve dissolution rates higher than 200 Å/sec with this type of copolymer, it would appear that a lower Mw would be required.

TABLE 1

| Ex. | Polymer | Monomers | Composition* | Mw | Mw/Mn | Dissolution rate (Å/sec) |
| --- | --- | --- | --- | --- | --- | --- |
| 1 (Comp) | P-1 | IAM/aGBLMA/HAMA | 30/50/20 | 6,000 | 1.42 | 134 |
| 2 (Comp) | P-2 | IAM/aGBLMA/HAMA | 30/50/20 | 7,800 | 1.53 | 78 |
| 3 (Comp) | P-3 | IAM/aGBLMA/HAMA | 30/50/20 | 8,700 | 1.57 | 67 |
| 4 (Comp) | P-4 | IAM/aGBLMA/HAMA | 30/50/20 | 11,100 | 1.67 | 42 |
| 5 (Comp) | P-5 | IAM/aGBLMA/HAMA | 30/50/20 | 12,200 | 1.70 | 36 |
| 6 (Comp) | P-6 | IAM/aGBLMA/HAMA | 30/50/20 | 13,700 | 1.77 | 28 |
| 7 (Comp) | P-7 | IAM/aGBLMA/HAMA | 30/50/20 | 15,400 | 1.90 | 22 |
| 8 (Comp) | P-8 | IAM/aGBLMA/HAMA | 30/50/20 | 18,900 | 1.88 | 12 |
| 9 (Comp) | P-9 | IAM/aGBLMA/HAMA | 30/50/20 | 25,200 | 1.97 | N/A |

*Molar feed ratio in the polymerization
"Comp" = comparative example

The effect of leaving group monomer structures on dissolution rates is summarized in Table 2. It was found that alkyl adamantyl leaving group monomers such as EAMA and MAMA gave relative low dissolution rates as observed with 2-adamantylpropyl methacrylate (IAM) in Examples 1-9. When a smaller leaving group monomer such as 1-ethylcyclopentyl methacrylate (ECPMA) was introduced in place of alkyladamantyl leaving group monomers in Examples 10 and 11, a much higher dissolution rate was observed as in Example 12. A similar effect of a leaving group monomer on dissolution rates was also observed with copolymers having different polar monomers such as CNNMA (Examples 13 and 14) and CMAMA (Examples 15 and 16). A smaller leaving group monomer such as ECPMA gives almost twice higher dissolution rates compared with bulky adamantly containing leaving group monomers such as IAM, EAMA, or MAMA.

TABLE 2

| Ex. | Polymer | Monomers | Composition* | Mw | Mw/Mn | Dissolution rate (Å/sec) |
|---|---|---|---|---|---|---|
| 10 (Comp) | P-10 | EAMA/aGBLMA/HAMA | 40/40/20 | 10,100 | 1.70 | 58 |
| 11 (Comp) | P-11 | MAMA/aGBLMA/HAMA | 40/40/20 | 10,600 | 1.75 | 79 |
| 12 (Comp) | P-12 | ECPMA/aGBLMA/HAMA | 40/40/20 | 10,200 | 1.64 | 121 |
| 13 (Comp) | P-13 | MAMA/aGBLMA/CNNMA | 40/40/20 | 10,800 | 1.62 | 66 |
| 14 (Comp) | P-14 | ECPMA/aGBLMA/CNNMA | 40/40/20 | 10,700 | 1.52 | 128 |
| 15 (Comp) | P-15 | MAMA/aGBLMA/CMAMA | 40/40/20 | 10,400 | 1.82 | 65 |
| 16 (Comp) | P-16 | ECPMA/aGBLMA/CMAMA | 40/40/20 | 10,200 | 1.64 | 109 |

*Molar feed ratio in the polymerization
"Comp" = comparative example

The effect of cage lactone monomers on dissolution rates is summarized in Table 3. Cage lactone monomers, such as NLM, OTDMA, and MNLMA, are preferred due to their etch resistance compared to smaller lactones such as aGBLMA. However, it was found that only MNLMA containing copolymers give a uniform dissolution behavior in 2-heptanone, whereas NLM and OTDMA containing copolymers yielded a non-uniform dissolution behavior across the wafer most probably due to their poor solubility in a 2-heptanone developer. As observed in Table 3, copolymers with lower Mw yielded higher dissolution rates (Examples 19-22) than copolymers with higher Mw.

TABLE 3

| Ex. | Polymer | Monomers | Composition* | Mw | Mw/Mn | Dissolution rate (Å/sec) |
|---|---|---|---|---|---|---|
| 17 (Comp) | P-17 | MCPMA/NLM | 50/50 | 8,063 | 1.46 | N/A** |
| 18 (Comp) | P-18 | MCPMA/OTDMA | 50/50 | 8,814 | 1.51 | N/A** |
| 19 (Comp) | P-19 | MCPMA/MNLMA | 50/50 | 8,853 | 1.46 | 138 |
| 20 (Comp) | P-20 | MCPMA/MNLMA | 50/50 | 7,324 | 1.44 | 175 |
| 21 (Comp) | P-21 | MCPMA/MNLMA | 50/50 | 6,916 | 1.40 | 207 |
| 22 (Comp) | P-22 | MCPMA/MNLMA | 50/50 | 6,300 | 1.38 | 260 |

*Molar feed ratio in the polymerization
**Measurement errors were too high due to the non-uniform dissolution across the wafer.
"Comp" = comparative example Table 4 shows the effect of acrylic monomers on dissolution rate. P-24 polymer with 3-hydroxyadamantyl acrylate (HADA) exhibited the highest dissolution rate among polymers P-1 to P-24. In contrast, P-23 polymer with 3-hydroxyadamantyl methacrylate (HAMA) exhibited a non-uniform dissolution behavior possibly due to its poor solubility in a 2-heptanone developer. Although monomer composition is slightly different, when MLNMA was used in place of OTDMA, P-25 polymer exhibited a uniform dissolution behavior with a reasonable dissolution rate. This is believed to demonstrate again that MNLMA is more preferable in the NTD process compared to other cage lactone monomers such as OTDMA or NLM. A similar observation was made with P-12 polymer that contains the same leaving group and polar group monomers but a smaller lactone (aGBLMA) in a slightly different monomer composition. Both ECPMA and MCPMA leaving group monomers appear to give similar dissolution behavior as in Examples 31 and 32.

TABLE 4

| Ex. | Polymer | Monomers | Composition* | Mw | Mw/Mn | Dissolution rate (Å/sec) |
|---|---|---|---|---|---|---|
| 29 (Comp) | P-23 | ECPMA/OTDMA/HAMA | 35/40/25 | 7,500 | 1.64 | N/A** |
| 30 (Comp) | P-24 | ECPMA/OTDMA/HADA | 35/40/25 | 7,500 | 1.77 | 613 |
| 31 | P-25 | ECPMA/MNLMA/HAMA | 50/30/20 | 10,904 | 1.44 | 128 |
| 32 | P-26 | MCPMA/MNLMA/HAMA | 50/30/20 | 10,535 | 1.46 | 135 |

Figure 2:
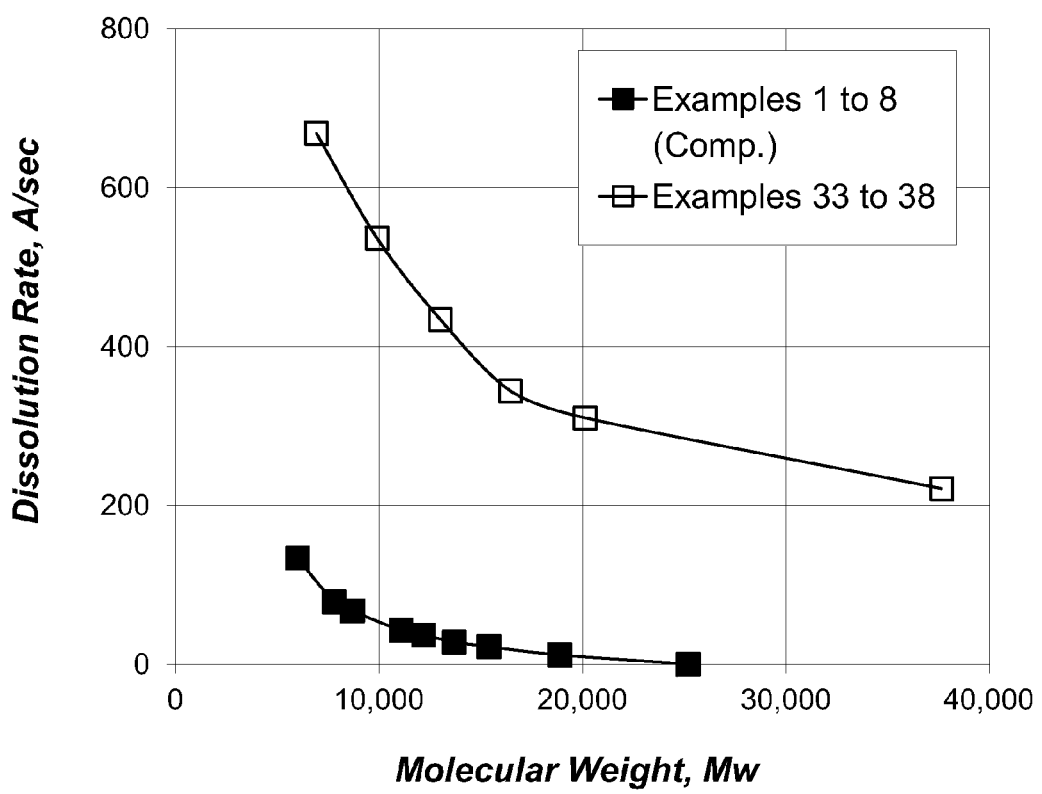
FIG. 2 is a graph showing dissolution rate as a function of Mw for photoresist compositions of the Examples.

*Molar feed ratio in the polymerization
**Measurement errors were too high due to the non-uniform dissolution across the wafer.
"Comp" = comparative example Table 5 provides dissolution rates obtained with copolymers formed from the same monomers but having different molecular weights, prepared with a smaller leaving group monomer (ECPMA and MCPMA), extended lactone (MNLMA) and HADA. It was found that dissolution rate can effectively be controlled by changing Mw. It was also found that even very high Mw polymers (Mw greater than 20,000) exhibited reasonably high dissolution rates for polymers prepared using monomers that contribute to higher dissolution rates. FIG. 2 shows the effects of monomer structure on dissolution rates by comparing polymers in Table 1 (Examples 1 to 8) with those in Table 5 (Examples 33 to 38).

TABLE 5

| Ex. | Polymer | Monomers | Composition* | Mw | Mw/Mn | Dissolution rate (Å/sec) |
|---|---|---|---|---|---|---|
| 33 | P-27 | ECPMA/MCPMA/MNLMA/HADA | 15/35/30/20 | 6,924 | 1.41 | 668 |
| 34 | P-28 | ECPMA/MCPMA/MNLMA/HADA | 15/35/30/20 | 9,903 | 1.45 | 536 |
| 35 | P-29 | ECPMA/MCPMA/MNLMA/HADA | 15/35/30/20 | 13,017 | 1.57 | 434 |
| 36 | P-30 | ECPMA/MCPMA/MNLMA/HADA | 15/35/30/20 | 16,466 | 1.64 | 344 |
| 37 | P-31 | ECPMA/MCPMA/MNLMA/HADA | 15/35/30/20 | 20,135 | 1.65 | 310 |
| 38 | P-32 | ECPMA/MCPMA/MNLMA/HADA | 15/35/30/20 | 37,652 | 1.94 | 221 |

*Molar feed ratio in the polymerization

Photoresist Composition Preparation

Example 39

2.526 g of polymer P-17 was dissolved in 29.070 g of PGMEA, 19.380 g of cyclohexanone and 48.450 g of methyl-2-hydroxyisobutyrate. To this mixture was added 0.484 g of "PAG A" described below, 0.029 g of 1-(tert-butoxycarbonyl)-4-hydroxypiperidine quencher and 0.062 g of PnBMA. The resulting mixture was rolled on a roller for six hours and then filtered through a Teflon filter having a 0.2 micron pore size.

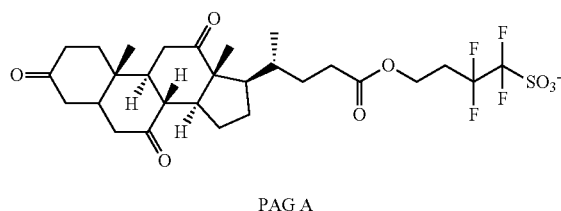

PAG A

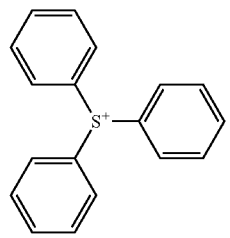

Examples 40-47

Additional formulations were prepared using the same procedures described above for the P-17 polymer with the components and amounts set forth in Table 6.

TABLE 6

| Ex. | Matrix Polymer | PnBMA | PAG | Quencher | Solv. A | Solv. B | Solv. C |
|---|---|---|---|---|---|---|---|
| 39 (Comp) | P-17 (2.526) | 0.062 | 0.484 | 0.029 | 29.070 | 19.380 | 48.450 |
| 40 (Comp) | P-18 (2.526) | 0.062 | 0.484 | 0.029 | 29.070 | 19.380 | 48.450 |
| 41 (Comp) | P-19 (2.526) | 0.062 | 0.484 | 0.029 | 29.070 | 19.380 | 48.450 |
| 42 (Comp) | P-20 (2.526) | 0.062 | 0.484 | 0.029 | 29.070 | 19.380 | 48.450 |
| 43 (Comp) | P-21 (2.526) | 0.062 | 0.484 | 0.029 | 29.070 | 19.380 | 48.450 |
| 44 (Comp) | P-22 (2.526) | 0.062 | 0.484 | 0.029 | 29.070 | 19.380 | 48.450 |
| 45 | P-25 (2.526) | 0.062 | 0.484 | 0.029 | 29.070 | 19.380 | 48.450 |
| 46 | P-26 (2.526) | 0.062 | 0.484 | 0.029 | 29.070 | 19.380 | 48.450 |
| 47 | P-31 (2.526) | 0.062 | 0.484 | 0.029 | 29.070 | 19.380 | 48.450 |

Quencher: 1-(tert-butoxycarbonyl)-4-hydroxypiperidine; Solvent A: propylene glycol monomethyl ether acetate; Solvent B: cyclohexanone, Solvent C: methyl-2-hydroxyisobutyrate. All contents in grams. "Comp" = comparative example.

Lithographic Evaluation 300 mm silicon wafers were spin-coated with AR™40A antireflectant (Rohm and Haas Electronic Materials) to form a first bottom antireflective coating (BARC) on a TEL CLEAN TRACK™ LITHIUS™ i+coater/developer. The wafers were baked for 60 seconds at 215° C., yielding a first BARC film thickness of 840 Å. A second BARC layer was next coated over the first BARC using AR™124 antireflectant (Rohm and Haas Electronic Materials), and was baked at 205° C. for 60 seconds to generate a 200 Å top BARC layer. Photoresist formulations were then coated on the dual BARC-coated wafers and soft-baked at 90° C. for 60 seconds on a TEL CLEAN TRACK™ LITHIUS™ i+coater/developer to provide a resist layer thickness of 900 Å.

The photoresist-coated wafers were exposed through a mask on an ASML TWINSCAN™ XT:1900i immersion scanner using a dipole illumination with 1.35 NA, 0.97 outer sigma, 0.85 inner sigma and X polarization. Immediately after the first exposure step, the wafers were exposed again using a different mask with a dipole illumination with 1.35 NA, 0.97 outer sigma, 0.85 inner sigma and Y polarization. The exposed wafers were post-exposure baked at 90° C. for 60 seconds and then developed using 2-heptanone for 25 seconds on a TEL CLEAN TRACK™ LITHIUS™ i+coater/developer to give negative tone patterns. Contact hole patterns were obtained with post patterns on the mask. Critical dimensions (CDs) were measured on a Hitachi CG4000 CD SEM at various mask CD and pitches. Optimum energy ($E_{op}$) to print 40 nm holes was calculated by plotting the CD values of contact holes as a function of exposure energy using a mask with 40 nm 1:1 line/space CD. CD uniformity (CDU) of 40 nm contact holes was measured as a 3σ of 270 hole CD values. For each wafer, 30 images per die and 9 contact hole measurements per image were taken at 250K magnification.

The lithographic results are summarized in Table 7. Based on this data, MLNMA containing polymers (Examples 50-53) were found to exhibit better resolution than NML or OTDMA containing polymers (Examples 48 and 49, respectively). Also, CD uniformity was found to generally increase with lower Mw copolymers of MCPMA and MNLMA (Examples 50 to 53). Excellent CDU data was obtained for HAMA containing terpolymers (Examples 54 and 55). Although CDU value was relatively high for the P-31 polymer containing formulation (Example 56), this formulation also resulted in the best top-down profile.

TABLE 7

| Ex. | Polymer | Mw | Dissolution rate (Å/sec) | Eop (mJ/cm²) | 3σ CDU (nm) |
|---|---|---|---|---|---|
| 48 (Comp) | P-17 | 8,063 | N/A* | 45.2 | N/A** |
| 49 (Comp) | P-18 | 8,814 | N/A* | 31.6 | N/A** |
| 50 (Comp) | P-19 | 8,823 | 138 | 20.3 | 3.81 |
| 51 (Comp) | P-20 | 7,324 | 175 | 22.6 | 4.54 |
| 52 (Comp) | P-21 | 6,916 | 207 | 22.7 | 4.28 |
| 53 (Comp) | P-22 | 6,300 | 260 | 23.3 | 5.02 |
| 54 | P-25 | 10,904 | 128 | 27.3 | 3.76 |
| 55 | P-26 | 10,535 | 135 | 41.4 | 4.02 |
| 56 | P-31 | 20,135 | 310 | 36.7 | 5.62 |

*Measurement errors were too high due to the non-uniform dissolution across the wafer.
**Measurement was not carried out due to poor fidelity of contact holes.
"Comp" = comparative example

What is claimed is:

1. A photoresist composition, comprising:
a first polymer comprising units of the following general formulae (I), (II) and (III):

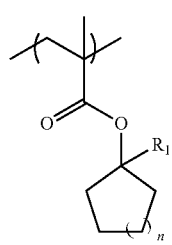
(I)

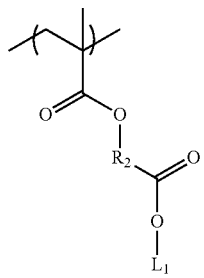
(II)

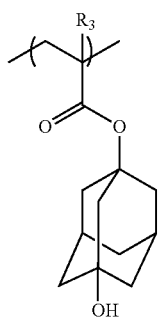
(III)

wherein: $R_1$ represents a $C_1$ to $C_3$ alkyl group; $R_2$ represents a $C_1$ to $C_3$ alkylene group; $R_3$ represents hydrogen or methyl; $L_1$ represents a lactone group; and n is 1 or 2;

a second polymer which is a $C_3$ to $C_7$ alkyl (meth)acrylate homopolymer or copolymer, wherein the second polymer is free of silicon and fluorine and is free of photoacid-labile groups; and a photoacid generator.

2. The photoresist composition of claim 1, wherein the first polymer is represented by the following formula:

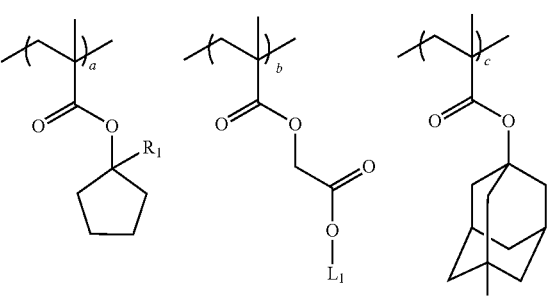

wherein: 0.3<a<0.7; 0.3<b<0.6; and 0.1<c<0.3.

3. The photoresist composition of claim 1, wherein the first polymer further comprises a second unit of the general formula (I), wherein $R_1$ in the first and second units of general formula (I) are different.

4. The photoresist composition of claim 3, wherein the first polymer is represented by the following formula:

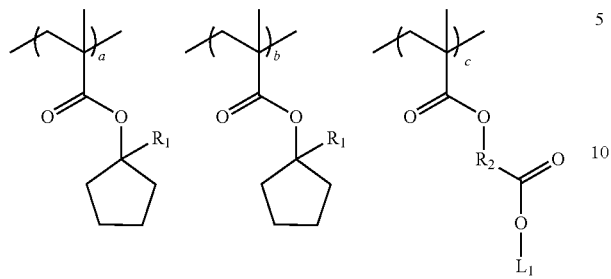

wherein: 0.1<a<0.5; 0.1<b<0.5; 0.2<c<0.6; and 0.1<d<0.3.

5. The photoresist composition of claim 1, wherein the first polymer further comprises a unit of the following general formula (IV):

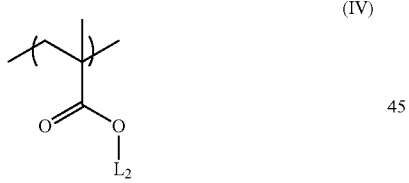

(IV)

wherein: L₂ is a lactone group; and the unit of general formula (IV) is different from the unit of general formula (II).

6. The photoresist composition of claim 5, wherein the first polymer is represented by the following formula:

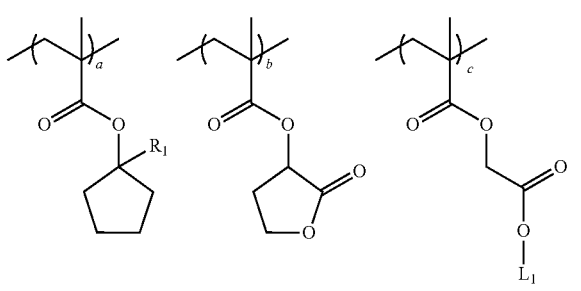

-continued

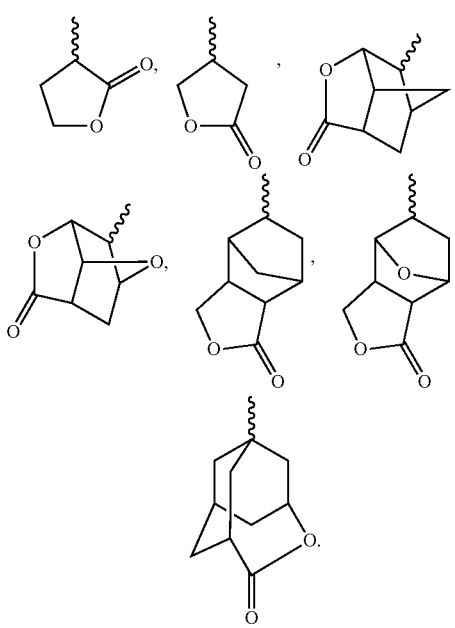

wherein: 0.3<a<0.7; 0.1<b<0.4; 0.1<c<0.4, and 0.1<d<0.3.

7. The photoresist composition of claim 5, wherein L₁ and L₂ are independently chosen from the following lactone groups:

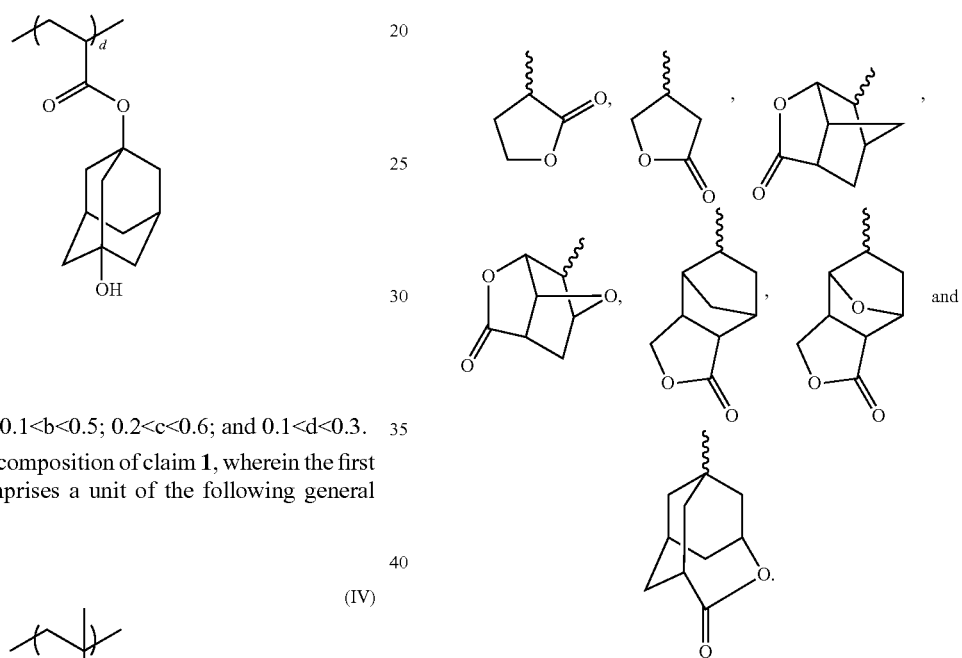

8. The photoresist composition of claim 1, wherein the second polymer is a poly(n-butyl methacrylate) homopolymer.

9. The photoresist composition of claim 1, wherein the second polymer is a copolymer comprising units of n-butyl methacrylate and a second $C_3$ to $C_7$ alkyl (meth)acrylate different from the n-butyl methacrylate.

10. A coated substrate, comprising a substrate and a layer of a photoresist composition of claim 1 over a surface of the substrate.

11. A method of forming a photolithographic pattern, comprising:
   (a) providing a substrate comprising one or more layer to be patterned over a surface of the substrate;
   (b) applying a layer of a photoresist composition of claim 1 over the one or more layer to be patterned;
   (c) patternwise exposing the photoresist composition layer to actinic radiation;
   (d) heating the exposed photoresist composition layer in a post-exposure bake process; and
   (e) applying a developer to the photoresist composition layer to remove a portion of the photoresist layer, thereby forming a photoresist pattern, wherein unexposed regions of the photoresist layer are removed by the developer to form the photoresist pattern.

12. The method of claim 11, wherein the developer comprises 2-heptanone.

13. The method of claim 11, wherein the developer comprises n-butyl acetate.

14. The method of claim 11, wherein the first polymer is represented by the following formula:

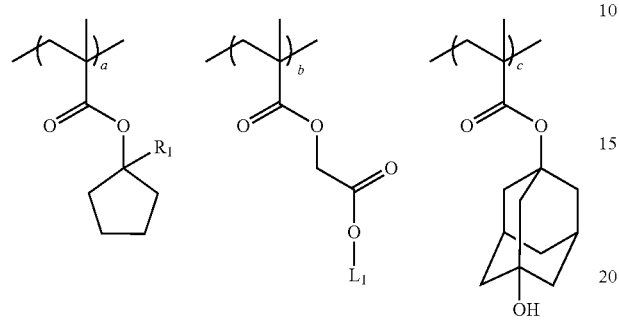

wherein: 0.3<a<0.7; 0.3<b<0.6; and 0.1<c<0.3.

15. The method of claim 11, wherein the first polymer further comprises a second unit of the general formula (I), wherein $R_1$ in the first and second units of general formula (I) are different.

16. The method of claim 15, wherein the first polymer is represented by the following formula:

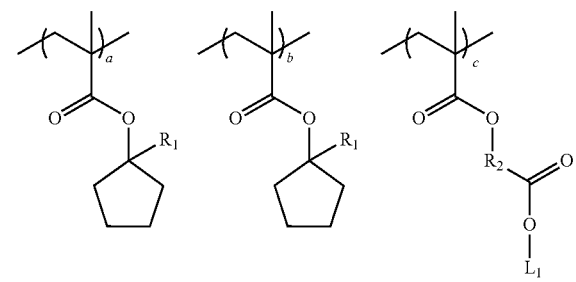

-continued

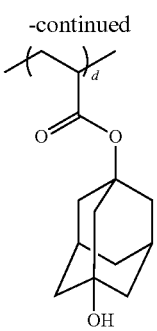

wherein: 0.1<a<0.5; 0.1<b<0.5; 0.2<c<0.6; and 0.1<d<0.3.

17. The method of claim 11, wherein the first polymer further comprises a unit of the following general formula (IV):

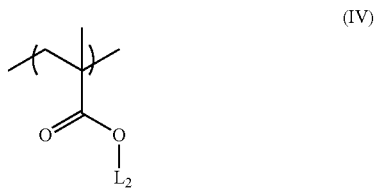

(IV)

wherein: $L_2$ is a lactone group; and the unit of general formula (IV) is different from the unit of general formula (II).

18. The method of claim 11, wherein the second polymer is a poly(n-butyl methacrylate) homopolymer.

19. The method of claim 11, wherein the second polymer is a copolymer comprising units of n-butyl methacrylate and a second $C_3$ to $C_7$ alkyl (meth)acrylate different from the n-butyl methacrylate.

* * * * *